United States Patent
Mofidi et al.

(10) Patent No.: US 10,432,267 B1
(45) Date of Patent: Oct. 1, 2019

(54) SCANNING PERFORMANCE

(71) Applicant: QUALCOMM Incorporated, San Diego, CA (US)

(72) Inventors: Mahbod Mofidi, San Diego, CA (US); Anthony Planinac, Oceanside, CA (US); Alberto Salcedo, Chula Vista, CA (US); Salvatore Pennisi, Irvine, CA (US); Marcus Noland Funk, Georgetown, IN (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/059,010

(22) Filed: Aug. 8, 2018

Related U.S. Application Data

(60) Provisional application No. 62/664,928, filed on Apr. 30, 2018.

(51) Int. Cl.
| | | |
|---|---|---|
| *H04B 5/00* | (2006.01) | |
| *H04L 12/46* | (2006.01) | |
| *H03L 7/08* | (2006.01) | |
| *H03L 5/00* | (2006.01) | |

(52) U.S. Cl.
CPC .......... *H04B 5/0031* (2013.01); *H03L 5/00* (2013.01); *H03L 7/08* (2013.01); *H04L 12/4604* (2013.01)

(58) Field of Classification Search
CPC . H04W 48/16; H04W 52/0238; H04W 84/12; Y02D 70/142
See application file for complete search history.

(56) References Cited

U.S. PATENT DOCUMENTS

| | | | |
|---|---|---|---|
| 7,786,913 | B2 | 8/2010 | Waheed et al. |
| 8,594,023 | B2 | 11/2013 | He et al. |
| 9,048,848 | B2 | 6/2015 | Chen et al. |
| 9,125,140 | B2 | 9/2015 | Maniatopoulos et al. |
| 9,628,262 | B1 | 4/2017 | Moe |
| 9,807,621 | B1 * | 10/2017 | Hui ..................... H04W 24/10 |
| 2008/0232345 | A1 * | 9/2008 | Espina ................ H04W 16/14 |
| | | | 370/350 |

(Continued)

FOREIGN PATENT DOCUMENTS

| | | |
|---|---|---|
| CN | 103996297 A | 8/2014 |
| EP | 1780892 A1 | 5/2007 |
| WO | WO-2005029344 A1 | 3/2005 |

OTHER PUBLICATIONS

IEEE Standard for Local and metropolitan area networks—Part 15.4: Low-Rate Wireless Personal Area Networks (LR-WPANs) IEEE Std 802.15.4-2011, p. 24-27, Sep. 5, 2011 (Year: 2011).*

(Continued)

*Primary Examiner* — David Bilodeau
(74) *Attorney, Agent, or Firm* — Muncy, Geissler, Olds & Lowe, P.C./Qualcomm

(57) ABSTRACT

Exemplary systems, apparatus, and methods described herein may improve a scan process for near field communications, such as IEEE 802.15.4. The improvements may include, during the scan process, performing one of increasing a current of a voltage controlled oscillator (VCO)/digitally controlled oscillator (DCO) of a second wireless device, reducing a bandwidth of a phased locked loop, increasing the bandwidth of the phased locked loop, changing a reference frequency of the phased locked loop, or dithering the reference frequency.

20 Claims, 8 Drawing Sheets

(56) References Cited

U.S. PATENT DOCUMENTS

| | | | |
|---|---|---|---|
| 2010/0080134 A1* | 4/2010 | Maniatopoulos | H04W 48/16 370/252 |
| 2010/0091715 A1* | 4/2010 | Akchurin | H04W 4/20 370/329 |
| 2010/0093279 A1 | 4/2010 | Linsky et al. | |
| 2013/0223334 A1* | 8/2013 | Guo | H04W 84/18 370/328 |

OTHER PUBLICATIONS

International Search Report and Written Opinion—PCT/US2019/024395—ISA/EPO—dated Jun. 26, 2019.

* cited by examiner

SCANNING PERFORMANCE

CROSS-REFERENCE TO RELATED APPLICATIONS

The present Application for patent claims the benefit of U.S. Provisional Application No. 62/664,928, entitled "IMPROVED SCANNING PERFORMANCE", filed Apr. 30, 2018, assigned to the assignee hereof, and expressly incorporated herein by reference in its entirety.

FIELD OF DISCLOSURE

This disclosure relates generally to wireless communication and more specifically, but not exclusively, to near field wireless communication.

BACKGROUND

Institute of Electrical and Electronics Engineers (IEEE) is responsible for the standards that govern wireless communication. One such standard, IEEE 802.15.4, is a technical standard which defines the operation of low-rate wireless personal area networks (LR-WPANs). It specifies the physical layer and media access control for LR-WPANs. It is the basis for the ZigBee, ISA100.11a, WirelessHART, MiWi, SNAP, and Thread specifications, each of which further extends the standard by developing the upper layers which are not defined in IEEE 802.15.4. Alternatively, it can be used with 6LoWPAN, the technology used to deliver the IPv6 version of the Internet Protocol (IP) over WPANs, to define the upper layers.

IEEE standard 802.15.4 intends to offer the fundamental lower network layers of a type of wireless personal area network (WPAN) which focuses on low-cost, low-speed ubiquitous communication between devices. It can be contrasted with other approaches, such as Wi-Fi, which offer more bandwidth and require more power. The emphasis is on very low cost communication of nearby devices with little to no underlying infrastructure, intending to exploit this to lower power consumption even more.

The basic framework conceives a 10-meter communications range with a transfer rate of 250 kbit/s. Tradeoffs are possible to favor more radically embedded devices with even lower power requirements, through the definition of not one, but several physical layers. Lower transfer rates of 20 and 40 kbit/s were initially defined, with the 100 kbit/s rate being added in the current revision. Even lower rates can be considered with the resulting effect on power consumption. As already mentioned, the main identifying feature of IEEE 802.15.4 among WPANs is the importance of achieving extremely low manufacturing and operation costs and technological simplicity, without sacrificing flexibility or generality. Important features include real-time suitability by reservation of guaranteed time slots, collision avoidance through CSMA/CA and integrated support for secure communications. Devices also include power management functions such as link quality and energy detection.

IEEE 802.15.4-conformant devices may use one of three possible frequency bands for operation: 868.0-868.6 MHz, 902-928 MHz, and 2400-2483.5 MHz. IEEE 802.15.4 includes a Scan process, but that Scan process has several drawbacks as will be discussed below.

The IEEE 802.15.4 Scan process gives a device the ability to find a network, to associate to that network, and to disassociate from that network as necessary. It is possible, however, for unintended devices to join a given IEEE 802.15.4 network. During the 802.15.4 Scan process, used by a device to try to join an existing network, the device listens for beacons from active devices (PAN coordinators), which are transmitting them. System, network, and or channel conditions can cause devices to join or receive information from unintended networks in one of two ways. In the case of an active scan, the scanning device transmits a beacon request on a particular channel that could be received by active devices on a wrong channel. In the case of active as well as passive scans, the beacon response may be received on a channel different than what the active device transmitted it on.

In both cases the Media Access Control (MAC) layer reports this scan result to the upper layer stack using its current channel as it has no way of knowing if it was due to an erroneous condition. At this point the 802.15.4 Stack will start the association process based on information in the scan result having the incorrect channel Therefore, new systems, apparatus, and methods are needed that maximize the probability of successful and reliable scans to minimize unintended devices from joining a given IEEE 802.15.4 network, and additionally to join the network on the intended channel.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a method includes: transmitting a request to associate from a first wireless device to a second wireless device; receiving the request to associate from the first wireless device at the second wireless device; initiating a scan process at the second wireless device in response to the received request to associate; during the scan process, performing one of increasing a current of a voltage controlled oscillator (VCO)/digitally controlled oscillator (DCO) of the second wireless device, reducing a bandwidth of the phased locked loop, increasing the bandwidth of the phased locked loop, changing a reference frequency of the phased locked loop, or dithering the reference frequency.

In another aspect, an apparatus includes: an antenna; and an oscillator circuit coupled to the antenna; wherein the oscillator circuit comprises a crystal oscillator, a dither block, a phase and frequency detector, a charge pump, a phased locked loop filter, a voltage controlled oscillator (VCO)/digitally controlled oscillator (DCO), and a signal output, the oscillator circuit configured to perform, during a scan process, one of increase a current of the VCO/DCO, reducing a bandwidth of the phased locked loop filter, increasing the bandwidth of the phased locked loop filter, changing a reference frequency of the phased locked loop filter, or dithering the reference frequency.

In still another aspect, a non-transitory computer-readable medium comprising instructions that when executed by a processor cause the processor to perform a method including: transmitting a request to associate from a first wireless device to a second wireless device; receiving the request to associate from the first wireless device at the second wireless device; initiating a scan process at the second wireless device in response to the received request to associate; during the scan process, performing one of increasing a current of a voltage controlled oscillator (VCO)/digitally controlled oscillator (DCO) of the second wireless device, reducing a bandwidth of the phased locked loop, increasing the bandwidth of the phased locked loop, changing a reference frequency of the phased locked loop, or dithering the reference frequency.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
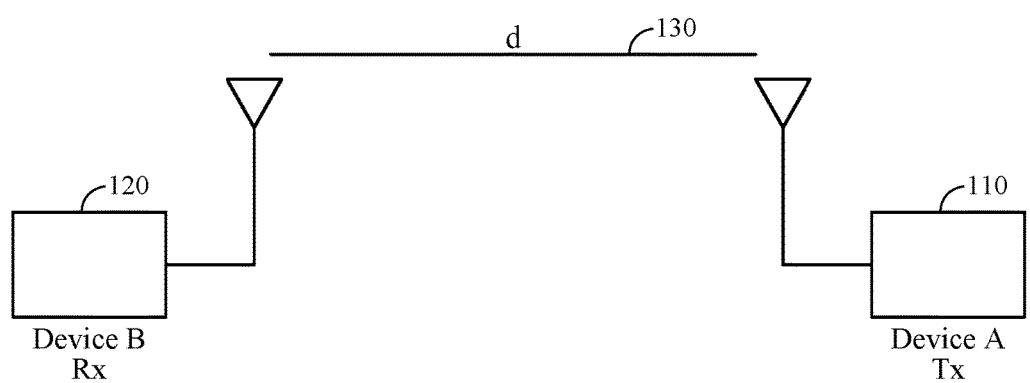
FIG. 1 illustrates an exemplary two wireless device spatial diagram in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. For example, systems, apparatus, and methods described herein may improve a scan process for near field communications, such as IEEE 802.15.4. The improvements may include, during the scan process, performing one of increasing a current of a voltage controlled oscillator (VCO)/digitally controlled oscillator (DCO) of a second wireless device, reducing a bandwidth of the phased locked loop, increasing the bandwidth of the phased locked loop, changing a reference frequency of the phased locked loop, or dithering the reference frequency.

In this description, certain terminology is used to describe certain features. The term Internet of Things (IoT) is the network of physical devices, vehicles, home appliances and other items embedded with electronics, software, sensors, actuators, and connectivity which enables these devices to connect and exchange data, creating opportunities for more direct integration of the physical world into computer-based systems, resulting in efficiency improvements, economic benefits and reduced human exertions. The term "IoT" device may include a wireless device and it should be understood that use of the term "wireless device" herein includes an IoT device, whether mobile or stationary. The term "wireless device" can describe, and is not limited to, a music player, a video player, an entertainment unit, a navigation device, a communications device, a wireless device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 2:
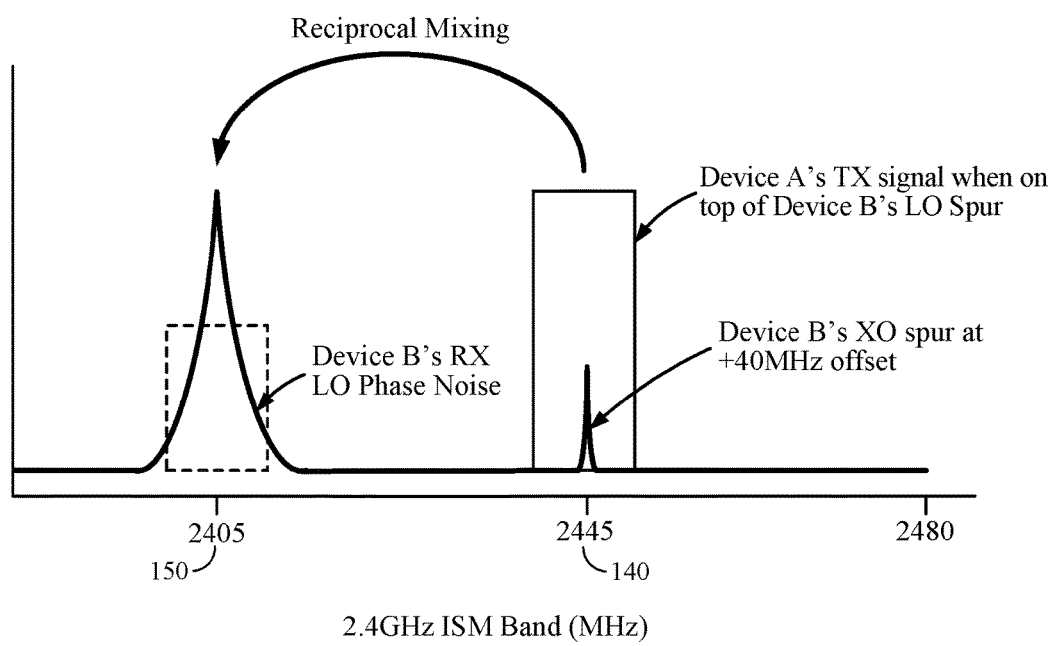
FIG. 2 illustrates an exemplary two wireless device reciprocal mixing issue in accordance with some examples of the disclosure.

FIG. 1 illustrates an exemplary two wireless device spatial diagram in accordance with some examples of the disclosure. As shown in FIG. 1, a first wireless device 110 may be configured to operate using IEEE 802.15.4, a second wireless device 120 may be configured to operate using IEEE 802.15.4, and the first wireless device 110 may be separated spatially from the second wireless device 120 by a first distance 130. To associate the first wireless device 110 with the second wireless device 120, the first wireless device 110 will utilize the 802.15.4 Scan process. The process begins with the first wireless device 110 transmitting a scan packet and the second wireless device 120 receiving the scan packet (request to associate). If the receiving local oscillator (RX LO) of the second wireless device 120 has higher phase noise and/or higher levels of spurs, specifically from the crystal oscillator (or other sources of frequency reference), and if the first wireless device 110's transmit frequency falls on top of the given spur, then via reciprocal mixing the scan packet of the first wireless device 110 will fall on top of the second wireless device 120's channel, as depicted in FIG. 2. Therefore, the second wireless device 120 will start the Scan process with the first wireless device 110 on the wrong channel.

FIG. 2 illustrates an exemplary two wireless device reciprocal mixing issue in accordance with some examples of the disclosure. As shown in FIG. 2, the first wireless device 110 may transmit packets on a first frequency 140 (e.g., 2445 MHz). The first frequency 140 may coincide with a spur of the second frequency 150 used by the second wireless device 120. Due to reciprocal mixing, the transmitted packets on the first frequency 140 are reduced in amplitude and shifted to the second frequency 150. The second wireless device 120 may not be aware that the first wireless device 110 was transmitting on a spur or harmonic of the second frequency 150 and may initiate an association with the first wireless device 110 on the second frequency 150. Meanwhile, the first wireless device 110 will begin the association using the first frequency 140 causing communication issues with errors, etc. until the first wireless device 110 is shifted properly to the second frequency 150.

Figure 3:
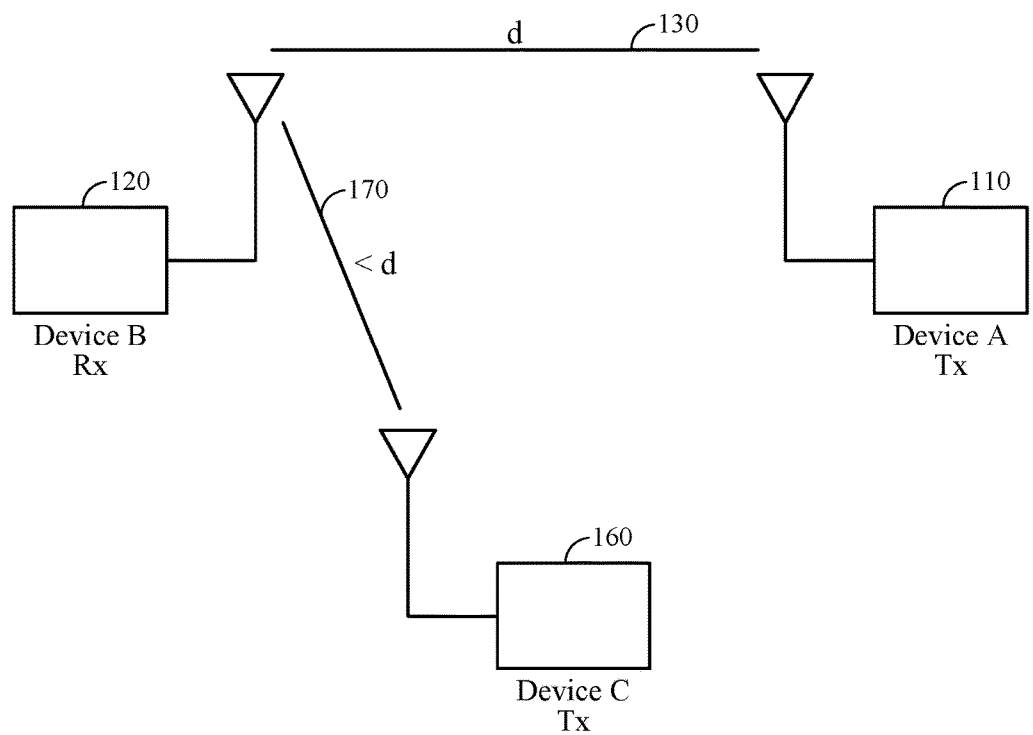
FIG. 3 illustrates an exemplary three wireless device spatial diagram in accordance with some examples of the disclosure.
Figure 4:
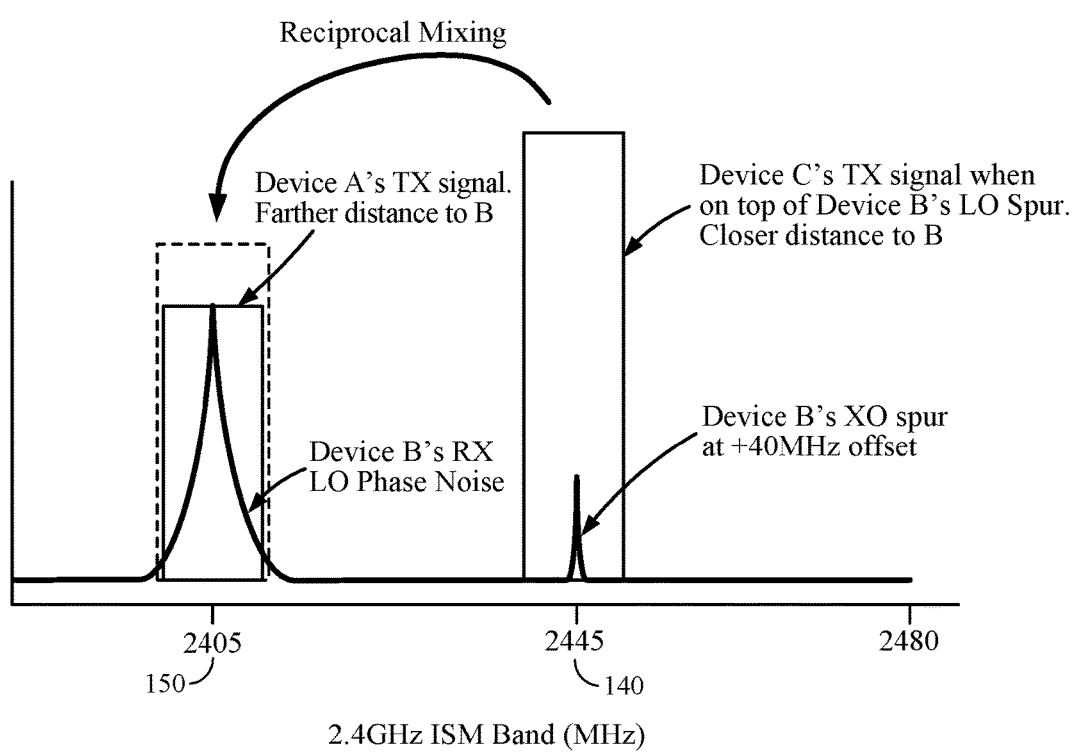
FIG. 4 illustrates an exemplary three wireless device reciprocal mixing issue in accordance with some examples of the disclosure.

FIG. 3 illustrates an exemplary three wireless device spatial diagram in accordance with some examples of the disclosure. As shown in FIG. 3, a first wireless device 110 may be configured to operate using IEEE 802.15.4, a second wireless device 120 may be configured to operate using IEEE 802.15.4, the first wireless device 110 may be separated spatially from the second wireless device 120 by a first distance 130, a third wireless device 160 may be configured to operate using IEEE 802.15.4, and the third wireless device 160 may be separated spatially from the second wireless device 120 by a second distance 170. One problem that may occur in this scenario is that reciprocal mixing may also cause scan results from the third wireless device 160 (or more unwanted devices) to confuse the Scan process. During the 802.15.4 Scan process, the second wireless device 120 would detect other 802.15.4 strong signals not coming from the first wireless device 110 but from the third wireless device 160. This anomaly occurs due to reciprocal mixing at the second wireless device 120's RX, as seen in FIG. 4. More specifically, the unwanted 802.15.4 signal from the third wireless device 160, being much stronger than the wanted signal of the first wireless device 110 due to being closer (the second distance 170 is smaller than the first distance 130) to the second wireless device 120, causes the scan results to occur from this wrong device. With the second wireless device 120's RX LO spur present at the same frequency offset as the third wireless device 160's transmit frequency, the second wireless device 120's RX receives the scan response from the wrong device (the third wireless device 160) due to reciprocal mixing. This is shown in FIG. 4.

FIG. 4 illustrates an exemplary three wireless device reciprocal mixing issue in accordance with some examples of the disclosure. As can be seen in FIG. 4, the third wireless device 160 may transmit packets on the first frequency 140 (e.g. 2445 MHz). The first frequency 140 may coincide with a spur of the second frequency 150 used by the second wireless device 120 and the first wireless device 110 to communicate over the 802.15.4 network. Due to reciprocal mixing, the transmitted packets on the first frequency 140 are reduced in amplitude and shifted to the second frequency 150. The second wireless device 120 may not be aware that the third wireless device 160 was transmitting on a spur or harmonic of the second frequency 150 and may initiate an association with the third wireless device 160 on the second frequency 150. Meanwhile, the third wireless device 160 will begin the association using the first frequency 140 causing communication issues with errors, etc. until the third wireless device 160 is shifted properly to the second frequency 150. In addition, the transmissions from the third wireless device 160 may eclipse any transmissions from the first wireless device 110 since the reciprocally mixed transmissions from the third wireless device 160 may still be stronger at the second wireless device 120 than the transmissions from the first wireless device 110 without reciprocal mixing due to greater distance travels by the respective signals (the first distance 130 is greater than the second distance 170). Reciprocal mixing may occur due to a spur or because of high phase noise from the RX LO. In other words, if the blocker signal power down-converted to baseband by reciprocal mixing is high enough to shadow the wanted signal, then a false scan might occur. The system would eventually figure this out, however it would take more time to do so.

The reciprocal mixing issue can be compounded due to majority of 802.15.4 devices transmitting at very high output power (+21 dBm) within the 2.4 GHz ISM band in order to increase range and communication robustness. However, the side effect of high power unwanted 802.15.4 devices contributes to many devices confusing the situation and corrupting the initial Scan between the two intended devices. This will take more time for the system to eventually figure out that all these other devices were not the intended device.

Figure 5:
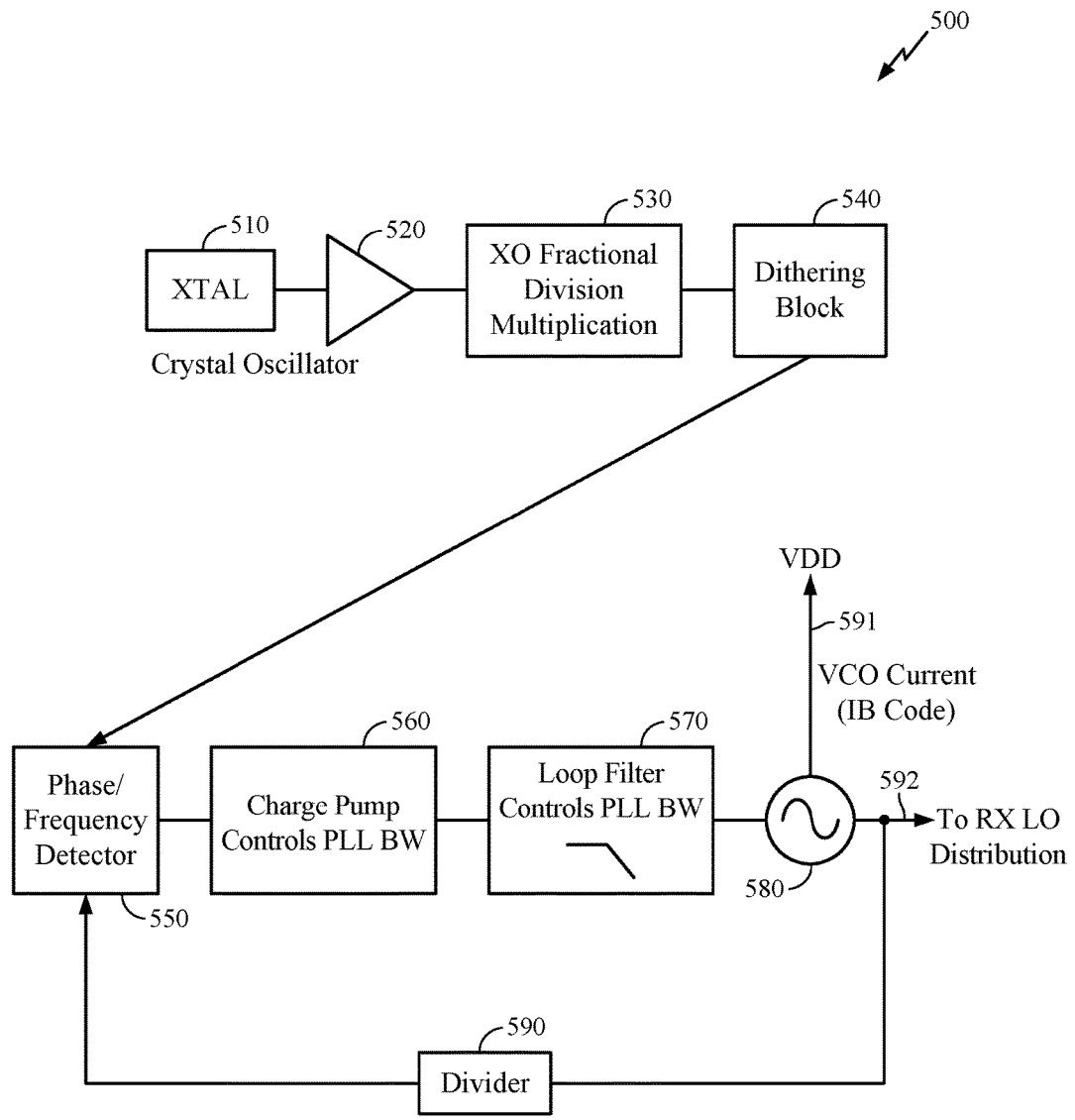
FIG. 5 illustrates an exemplary Phase Locked Loop diagram in accordance with some examples of the disclosure.

FIG. 5 illustrates an exemplary Phase Locked Loop (PLL) diagram in accordance with some examples of the disclosure. As shown in FIG. 5, a portion of wireless device 500 (e.g. the first wireless device 110, the second wireless device 120, and the third wireless device 160) may include components configure to utilize IEEE 802.15.4 for communicating with other devices. The components may include a crystal oscillator (XTAL) 510 coupled to an amplifier 520. The amplifier 520 may be coupled to a crystal oscillator (XO) fractional division multiplication logic component 530, which in turn is coupled to a dithering block 540. The dithering block 540 may be coupled to a phase/frequency detector 550, which in turn is coupled to a charge pump 560 that controls the PLL bandwidth (BW). The charge pump 560 may be coupled to a loop filter 570 that also controls the PLL BW, which in turn is coupled to a summation component 580. The summation component 580 may be coupled to voltage control oscillator (VCO) feed 591 from a system voltage source (VDD), a RX LO distribution 592 for use by the wireless device, and divider 590. The divider 590 may also be coupled to the phase/frequency detector 550.

The XO fractional division multiplication logic component 530, the dithering block 540, the charge pump 560, the loop filter 570, and the VCO feed 591 may be either set by software (SW)/firmware (FW) (software stored in read only memory) during a Scan Mode or by hardware (HW) registers when the device enters the Scan Mode.

Using a higher power during the scan progress in wireless device 500 may reduce the reciprocal mixing issue. Since the scanning process does not occur that often in the life of a 802.15.4 device, increasing the device's power consumption for this very short duration will not practically impact the battery life. For the case of devices plugged into main electrical power, it still has the advantage of more successful scan results, and therefore faster association times. The scan process duration is typically less than 10 milliseconds.

Alternatively, the wireless device 500 may reduce the phase noise and the local oscillator (LO) spurs levels. This approach increases the current in the LO during the scanning process to reduce the phase noise by making the oscillation signal stronger. Additionally, if the oscillator works in current-limited regime, increasing the oscillator current will also lower the spur level compared to the LO fundamental.

Both of these approaches are typically limited in order to reduce power consumption while meeting normal system requirements and specification during normal operations. However, during the Scan process it is best to lower phase noise and spur levels as much as possible.

In another alternative, the PLL Bandwidth may be modified during the 802.15.4 Scan process. When the clock reference into a PLL (Phase Lock Loop) is noisy, the PLL output phase noise becomes more dependent on the VCO (Voltage Controlled Oscillator) phase noise. Reducing the PLL BW can help to suppress this noise. The opposite is also true, i.e., if the VCO has higher noise contribution than the clock reference, then widening the PLL BW can help. The modification in the PLL Bandwidth is device-specific, and should be decided depending upon the spur/phase noise profile of the device. Thus, one technique to lower the probability of bogus scanning is to modify the PLL BW during the scanning phase in order to change the spur profile.

In another alternative, the fractional or harmonic of the Crystal Oscillator (XO) frequency may be used to move the spur out of band. This technique addresses the situation where the spur is due to harmonics of the clock reference frequency, which is derived from the Crystal Oscillator (XO) frequency. In this case the spur location is deterministic so it can be easily predicted. In this approach the receiver detects a scanning response. To make sure that the operation is correct, the XO frequency may be changed (for instance by dividing it by a non-integer fraction or using a DLL to push the XO frequency outside the operating bandwidth). Then identify if the previous scanning response was due to reciprocal mixing, thus lowering the probability of erroneous results.

In another alternative, the PLL reference may be dithered. In the case of reference frequency spurs (XO spurs), dithering can be used in order to reduce the spur level by reducing its peak energy at a given time. This spur reduction reduces reciprocal mixing. However, as dithering is increased the close-in phase noise of the PLL will increase. This higher close-in phase noise degrades RX sensitivity if it becomes too large. However, since the SNR requirement for 802.15.4 is not that stringent (depending on demodulator implementation it can be around only 0 dB, or even −2 dB) the impact to receiver sensitivity will be negligible. This allows for large levels of dithering to improve the Scan process.

Reference frequency spurs are actually symmetrical around the RX LO which results in at least 2 spurs. Additionally if the reference frequency is lower, say 19.2 MHz vs. 40 MHz, the 2nd and 3rd harmonics of the reference frequency will be present around the LO within the 2.4 GHz ISM band. In this case there are 2 spurs on one side of the LO and 2 more on the other side. Therefore, more unwanted devices on both sides of the LO can be reciprocally mixed on channel. This results in increasing the number of potential unwanted devices being falsely scanned. So it is beneficial to reduce the reference frequency spurs as much as possible.

Use of the above devices and techniques enhances the Link Quality Indicator. In order to improve the link stability, the Link Quality Indicator (LQI) threshold was degraded in order to limit the false channels and the false devices causing issues due to reciprocal mixing. Without these techniques the LQI was set to be around −70 dBm which obviously limits the RX performance during Scan and Association. With the implementation of these techniques the LQI threshold can be set near the device RX sensitivity. For example, the typical sensitivity for 802.15.4 devices ranges from −98 to −106 dBm.

With the above techniques, a FW mitigation used to limit the issues with false channels and devices is no longer needed. This mitigation involved comparing the received signal strength indication (RSSI) between various signals during Scan process, and used a major assumption that the reciprocally mixed signal would have a lower RSSI level than an actual on channel signal. However, as mentioned above with various distances between devices, high power transmissions, and high level of spurs, this assumption is not always valid. With the implementation of these techniques, via spur reduction during scan, the FW mitigation can be either removed or at least the assumption would become more valid due to spur level reduction which reduces the false RSSI levels from reciprocal mixing.

Figure 6:
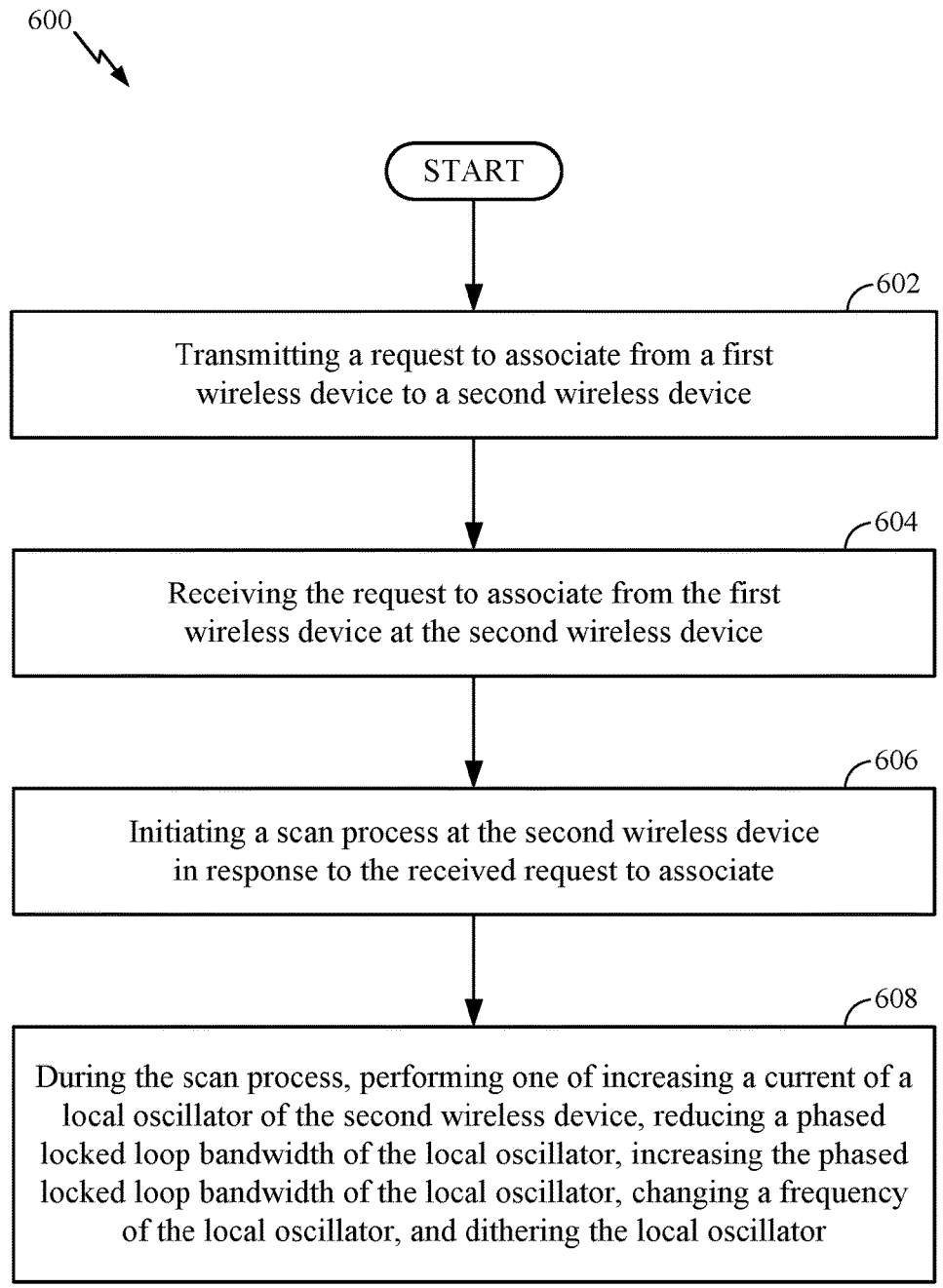
FIG. 6 illustrates an exemplary method of scanning in accordance with some examples of the disclosure.

FIG. 6 illustrates an exemplary method of scanning in accordance with some examples of the disclosure. As shown in FIG. 6, the partial method 600 begins in block 602 with transmitting a request to associate from a first wireless device (e.g., first wireless device 110) to a second wireless device (e.g., second wireless device 120). The partial method 600 continues in block 604 with receiving the request to associate from the first wireless device at the second wireless device. The partial method 600 continues in block 606 with initiating a scan process at the second wireless device in response to the received request to associate. The partial method 600 concludes in block 608 with, during the scan process, performing one of increasing a current of a local oscillator (e.g., crystal oscillator 510) of the second wireless device, reducing the phased locked loop bandwidth of the local oscillator, increasing the phased locked loop bandwidth of the local oscillator, changing the frequency of the local oscillator, and dithering the local oscillator.

Figure 7:
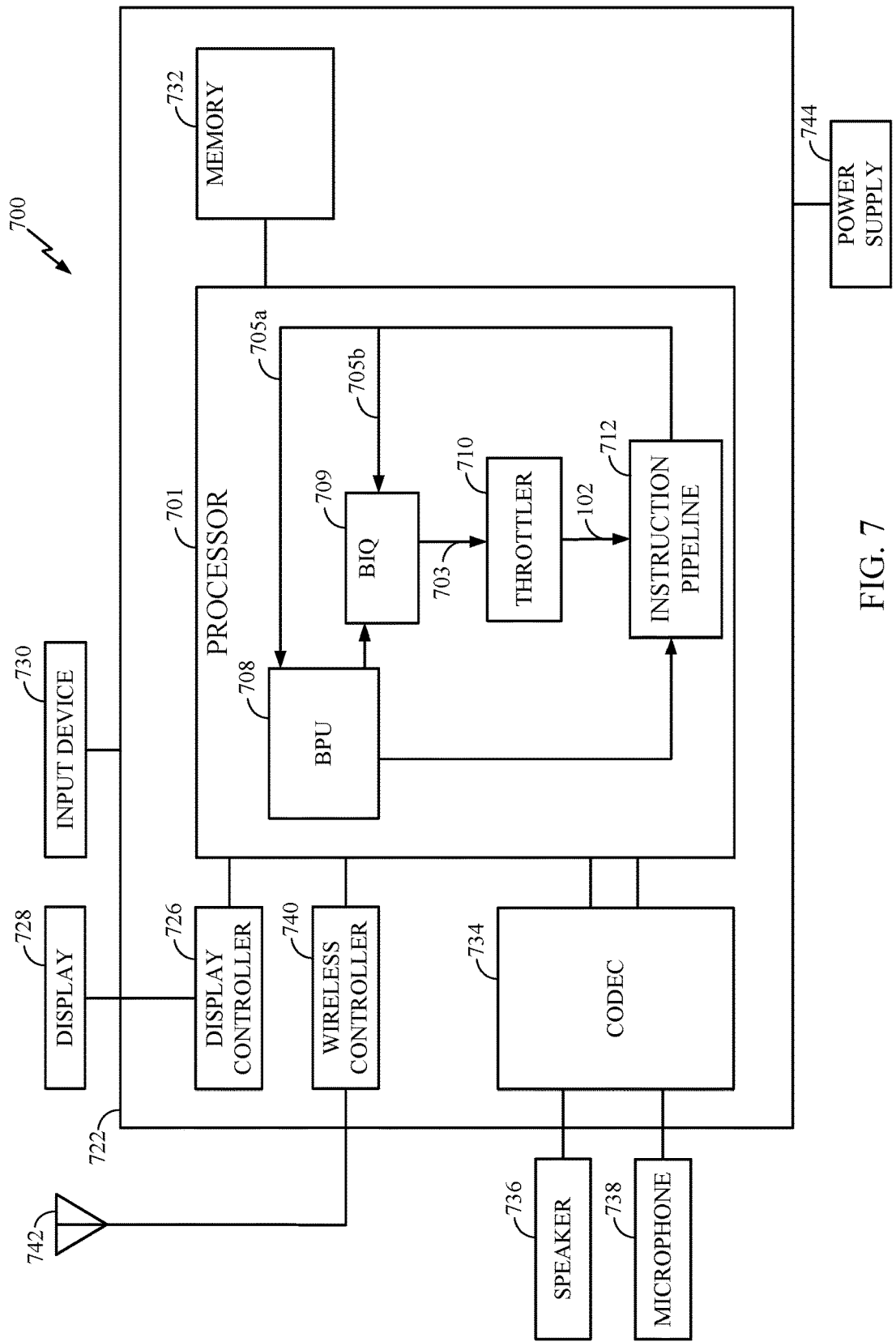
FIG. 7 illustrates an exemplary wireless device in accordance with some examples of the disclosure.

FIG. 7 illustrates an exemplary wireless device in accordance with some examples of the disclosure. Referring now to FIG. 7, a block diagram of a wireless device (e.g. the first wireless device 110, the second wireless device 120, and the third wireless device 160) that is configured according to exemplary aspects is depicted and generally designated 700. In some aspects, wireless device 700 may be configured as a wireless communication device. As shown, wireless device 700 includes processor 701, which may be configured to implement the methods described herein in some aspects. Processor 701 is shown to comprise instruction pipeline 712, buffer processing unit (BPU) 708, branch instruction queue (BIQ) 709, and throttler 710 as is well known in the art. Other well-known details (e.g., counters, entries, confidence fields, weighted sum, comparator, etc.) of these blocks have been omitted from this view of processor 701 for the sake of clarity.

Processor 701 may be communicatively coupled to memory 732. Wireless device 700 also include display 728 and display controller 726, with display controller 726 coupled to processor 701 and to display 728.

In some aspects, FIG. 7 may include coder/decoder (CODEC) 734 (e.g., an audio and/or voice CODEC) coupled to processor 701; speaker 736 and microphone 738 coupled to CODEC 734; and wireless controller 740 (which may include a modem) coupled to wireless antenna 742 and to processor 701.

In a particular aspect, where one or more of the above-mentioned blocks are present, processor 701, display controller 726, memory 732, CODEC 734, and wireless controller 740 can be included in a system-in-package or system-on-chip device 722. Input device 730 (e.g., physical or virtual keyboard), power supply 744 (e.g., battery), display 728, input device 730, speaker 736, microphone 738, wireless antenna 742, and power supply 744 may be external to system-on-chip device 722 and may be coupled to a component of system-on-chip device 722, such as an interface or a controller.

It should be noted that although FIG. 7 depicts a wireless device, processor 701 and memory 732 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 8:
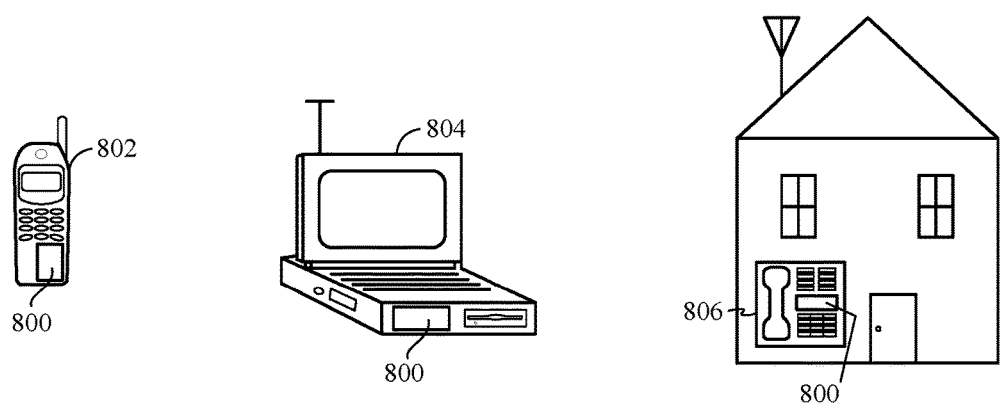
FIG. 8 illustrates various electronic devices that may be integrated with any of the aforementioned wireless devices in accordance with some examples of the disclosure.

FIG. 8 illustrates various electronic devices that may be integrated with any of the aforementioned wireless devices in accordance with some examples of the disclosure. For example, a mobile phone device 802 (e.g. the first wireless device 110, the second wireless device 120, and the third wireless device 160), a laptop computer device 804, and a fixed location terminal device 806 may include an integrated device 800 as described herein. The integrated device 800 may be, for example, any of the integrated circuits, integrated devices, and wireless devices described herein. The devices 802, 804, 806 illustrated in FIG. 8 are merely exemplary. Other electronic devices may also feature the integrated device 800 including, but not limited to, a group of devices (e.g., electronic devices) that includes wireless devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. For example, in one aspect, an apparatus (e.g. the first wireless device 110, the second wireless device 120, and the third wireless device 160) may comprise an antenna (e.g., wireless antenna 742) and means to oscillate (e.g., crystal oscillator 510) coupled to the antenna. The means to oscillate may comprise means to dither (e.g., dithering block 540), means to detect a phase and frequency (e.g., phase/frequency detector 550), means to charge (e.g., charge pump 560) the means to oscillate, means to filter (e.g., loop filter 570) the means to oscillate, means to input a current (e.g., VCO feed 591), and means to output a signal (e.g., RX LO distribution 592), the means to oscillate may be further configured to perform one of increase the current input, reduce a phased locked loop bandwidth of the means to oscillate, increase the phased locked loop bandwidth of the means to oscillate, change a frequency of the means to oscillate, and dithering the means to oscillate during a scan process. It will be appreciated that the aforementioned aspects are merely provided as examples and the various aspects claimed are not limited to the specific references and/or illustrations cited as examples.

One or more of the components, processes, features, and/or functions illustrated in FIGS. 1-8 may be rearranged and/or combined into a single component, process, feature or function or incorporated in several components, processes, or functions. Additional elements, components, processes, and/or functions may also be added without departing from the disclosure. It should also be noted that FIGS. 1-8 and its corresponding description in the present disclosure is not limited to dies and/or ICs. In some implementations, FIGS. 1-8 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be incorporated entirely within any form of computer readable storage medium having stored therein a corresponding set of computer instructions that upon execution would cause an associated processor to perform the functionality described herein. Thus, the various aspects of the disclosure may be incorporated in a number of different forms, all of which have been contemplated to be within the scope of the claimed subject matter. In addition, for each of the examples described herein, the corresponding form of any such examples may be described herein as, for example, "logic configured to" perform the described action.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A method for communicating, comprising:
   transmitting a request to associate from a first wireless device to a second wireless device;
   receiving the request to associate from the first wireless device at the second wireless device;
   initiating a scan process at the second wireless device in response to the received request to associate;
   during the scan process, performing one of
      reducing a bandwidth of a phased locked loop,
      increasing the bandwidth of the phased locked loop, or
      dithering the reference frequency.

2. The method of claim 1, wherein the second wireless device is a mobile device.

3. The method of claim 1, wherein the second wireless device is an Internet of Things device.

4. The method of claim 1, wherein the request is transmitted at a first frequency and the performing one of increasing the current of the VCO/DCO of the second wireless device, reducing a bandwidth of the phased locked loop, increasing the bandwidth of the phased locked loop, changing a reference frequency of the phased locked loop, or dithering the reference frequency reduces a reciprocal mixing of the first frequency.

5. The method of claim 4, wherein the first frequency is 2445 MHz.

6. The method of claim 1, wherein the increasing the current of the VCO/DCO of the second wireless device reduces a phase noise of an oscillator signal.

7. The method of claim 1, wherein the increasing the current of the VCO/DCO of the second wireless device lowers a spur level of the reference frequency.

8. The method of claim 1, wherein the reducing the bandwidth of the phased locked loop reduces the bandwidth from 40 MHz to 19.2 MHz.

9. The method of claim 1, wherein the method is incorporated into a device selected from the group consisting of a music player, a video player, an entertainment unit, a navigation device, a communications device, a wireless device, a mobile phone, a smartphone, a personal digital assistant, a fixed location terminal, a tablet computer, a computer, a wearable device, a laptop computer, a server, and a device in an automotive vehicle.

10. An apparatus, comprising:
an antenna; and
an oscillator circuit coupled to the antenna;
wherein the oscillator circuit comprises a crystal oscillator, a dither block, a phase and frequency detector, a charge pump, a phased locked loop filter, a voltage controlled oscillator (VCO)/digitally controlled oscillator (DCO), and a signal output, the oscillator circuit configured to perform,
during a scan process, one of
reducing a bandwidth of the phased locked loop filter,
increasing the bandwidth of the phased locked loop filter,
or
dithering the reference frequency.

11. The apparatus of claim 10, wherein the apparatus is a mobile device or an Internet of Things device.

12. The apparatus of claim 10, wherein the increase the current of the VCO/DCO reduces a phase noise of an oscillator signal.

13. The apparatus of claim 10, wherein the increasing the current of the VCO/DCO lowers a spur level of the reference frequency.

14. The apparatus of claim 10, wherein the reducing the bandwidth of the phased locked loop filter reduces the bandwidth from 40 MHz to 19.2 MHz.

15. The apparatus of claim 10, wherein the apparatus is incorporated into a device selected from the group consisting of a music player, a video player, an entertainment unit, a navigation device, a communications device, a wireless device, a mobile phone, a smartphone, a personal digital assistant, a fixed location terminal, a tablet computer, a computer, a wearable device, a laptop computer, a server, and a device in an automotive vehicle.

16. A non-transitory computer-readable medium comprising instructions that when executed by a processor cause the processor to perform a method comprising:
transmitting a request to associate from a first wireless device to a second wireless device;
receiving the request to associate from the first wireless device at the second wireless device;
initiating a scan process at the second wireless device in response to the received request to associate;
during the scan process, performing one of
reducing a bandwidth of a phased locked loop,
increasing the bandwidth of the phased locked loop,
or
dithering the reference frequency.

17. The non-transitory computer-readable medium of claim 16, wherein the second wireless device is a mobile device.

18. The non-transitory computer-readable medium of claim 16, wherein the second wireless device is an Internet of Things device.

19. The non-transitory computer-readable medium of claim 16, wherein the request is transmitted at a first frequency and the performing one of increasing a current of a VCO/DCO of the second wireless device, reducing a bandwidth of the phased locked loop, increasing the bandwidth of the phased locked loop, changing a reference frequency of the phased locked loop, or dithering the reference frequency reduces a reciprocal mixing of the first frequency.

20. The non-transitory computer-readable medium of claim 16, wherein the non-transitory computer-readable medium is incorporated into a device selected from the group consisting of a music player, a video player, an entertainment unit, a navigation device, a communications device, a wireless device, a mobile phone, a smartphone, a personal digital assistant, a fixed location terminal, a tablet computer, a computer, a wearable device, a laptop computer, a server, and a device in an automotive vehicle.

* * * * *